(12) United States Patent
Christensen et al.

(10) Patent No.: US 7,136,444 B2
(45) Date of Patent: Nov. 14, 2006

(54) TECHNIQUES TO REGENERATE A SIGNAL

(75) Inventors: Steen B. Christensen, Roskilde (DK); Casper Dietrich, Roskilde (DK)

(73) Assignee: Intel Corporation, Santa Clara, CA (US)

( * ) Notice: Subject to any disclaimer, the term of this patent is extended or adjusted under 35 U.S.C. 154(b) by 754 days.

(21) Appl. No.: 10/205,728

(22) Filed: Jul. 25, 2002

(65) Prior Publication Data
US 2004/0017871 A1 Jan. 29, 2004

(51) Int. Cl.
*H03D 3/24* (2006.01)
(52) U.S. Cl. ............... 375/373; 375/375; 375/376; 327/291
(58) Field of Classification Search ........... 375/226, 375/340, 355, 371, 373, 374, 376, 375; 327/39, 327/41, 47, 231, 243, 244, 291; 370/498, 370/516
See application file for complete search history.

(56) References Cited

U.S. PATENT DOCUMENTS

| | | | |
|---|---|---|---|
| 5,630,113 A | 5/1997 | Hayssen et al. | |
| 5,657,359 A * | 8/1997 | Sakae et al. | 375/376 |
| 5,815,298 A | 9/1998 | Cern | |
| 5,977,806 A * | 11/1999 | Kikuchi | 327/157 |
| 6,009,134 A * | 12/1999 | Yoon | 375/376 |
| 6,320,435 B1 | 11/2001 | Tanimoto | 327/156 |
| 6,449,576 B1 | 9/2002 | Bass et al. | |
| 6,535,567 B1 | 3/2003 | Girardeau, Jr. | |
| 6,539,051 B1 | 3/2003 | Grivna | |
| 6,823,001 B1 | 11/2004 | Chea | |
| 6,823,483 B1 | 11/2004 | Creigh | |
| 2002/0033738 A1 * | 3/2002 | Saeki et al. | 331/17 |
| 2002/0114416 A1 * | 8/2002 | Enam et al. | 375/373 |
| 2002/0159130 A1 * | 10/2002 | Sakano et al. | 359/326 |
| 2003/0185325 A1 | 10/2003 | Wahl | |
| 2004/0100335 A1 | 5/2004 | Abidin et al. | |
| 2004/0120406 A1 | 6/2004 | Searles et al. | |
| 2004/0228636 A1 * | 11/2004 | Pathak et al. | 398/155 |
| 2006/0033580 A1 * | 2/2006 | Chen et al. | 331/16 |

FOREIGN PATENT DOCUMENTS

EP 1 283 615 A2 2/2003

OTHER PUBLICATIONS

IEEE Std 802.3, Part 3: Carrier Sense multiple access with collision detection (CSMA/CD) access method and physical layer specifications, 1998 Edition, p. #1 & 42.*
European Patent Office, International Search Report for International Patent Application No. PCT/US2004/027730, 7 pages, Dec. 13, 2004.
European Patent Office, Written Opinion for International Patent Application No. PCT/US2004/027730, 5 pages, Dec. 13, 2004.
Office Action for U.S. Appl. No. 10/659,216, 15 Pages, Feb. 3, 2005.

(Continued)

*Primary Examiner*—Chieh M. Fan
*Assistant Examiner*—Naheed Ejaz
(74) *Attorney, Agent, or Firm*—Glen B Choi

(57) ABSTRACT

A signal regenerator that reduces noise in a reference clock signal. In one possible implementation, phase comparisons between the reference clock signal and an input signal are made. Based on the phase comparisons, phases of a clock signal having a lower frequency than the reference clock signal are adjusted. Phases of the phase adjusted lower frequency clock signal are compared with phases of a divided down version of the reference clock signal. Based on such comparisons, phases of the reference clock signal may be adjusted.

17 Claims, 4 Drawing Sheets

OTHER PUBLICATIONS

Christensen, Steen Bak, U.S. Appl. No. 10/659,216, entitled "Techniques to Test Transmitted Signal Integrity", filed Sep. 9, 2003, 26 pages including figures.

Final Office Action for U.S. Appl. No. 10/659,216, 12 pages, Jun. 27, 2005.

* cited by examiner

TECHNIQUES TO REGENERATE A SIGNAL

FIELD

The subject matter herein generally relates to the field of communications systems and in particular to techniques to regenerate a signal.

DESCRIPTION OF RELATED ART

Jitter is the general term used to describe distortion caused by deviations of a signal from its reference timing position. The deviation may be in the amplitude, time, frequency or phase of the signal. This deviation may cause errors in the recovery of data. It is desirable to transmit signals having a minimal amount of jitter.

BRIEF DESCRIPTION OF THE DRAWINGS

Note that use of the same reference numbers in different figures indicates the same or like elements.

DETAILED DESCRIPTION

Some embodiments of the present invention may be used in: a transmitter in an optical network compliant for example with optical transport network (OTN), Synchronous Optical Network (SONET), and/or Synchronous Digital Hierarchy (SDH) standards; a router or switch that transmits packets or frames; a transmitter that transmits signals in accordance with Ethernet (described for example in IEEE 802.3 and its related standards); and/or a wireless signal transmitter. When such transmitter is used in an optical network, it may comply for example with ITU-T Recommendation G.709, Interfaces for the Optical Transport Network (OTN) (2001); ANSI T1.105, Synchronous Optical Network (SONET) Basic Description Including Multiplex Structures, Rates, and Formats; Bellcore Generic Requirements, GR-253-CORE, Synchronous Optical Network (SONET) Transport Systems: Common Generic Criteria (A Module of TSGR, FR-440), Issue 1, December 1994; ITU Recommendation G.872, Architecture of Optical Transport Networks, 1999; ITU Recommendation G.825, "Control of Jitter and Wander within Digital Networks Based on SDH" March, 1993; ITU Recommendation G.957, "Optical Interfaces for Equipment and Systems Relating to SDH", July, 1995; ITU Recommendation G.958, Digital Line Systems based on SDH for use on Optical Fibre Cables, November, 1994; and/or ITU-T Recommendation G.707, Network Node Interface for the Synchronous Digital Hierarchy (SDH) (1996).

Figure 1:
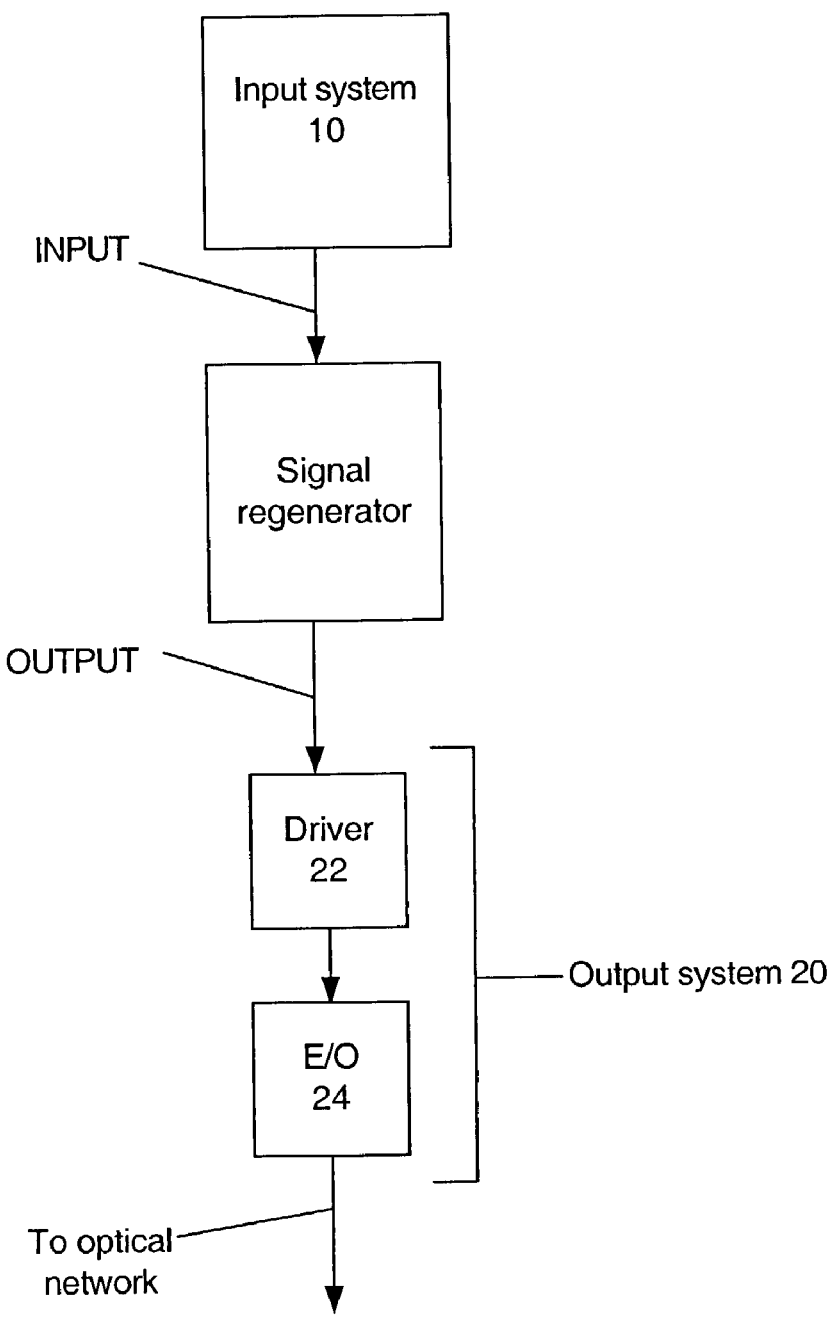
FIG. 1 depicts an example system in which some embodiments of the present invention may be used.

FIG. 1 depicts an example optical network transmitter in which some embodiments of the present invention may be used. Such transmitter may include an input system 10, signal regenerator, and an output system 20. Input system 10 may receive information such as data to be transmitted. For example, input system 10 may receive information from a data bus, which may receive such information from a switch fabric or packet processor. The data bus may be compliant, for example, with Ethernet. With respect to such information, input system 10 may perform media access control (MAC) management in compliance for example with Ethernet; framing and wrapping in compliance for example with ITU-T G.709; forward error correction (FEC) processing, for example in accordance with ITU-T G.975; and/or other layer 2 (e.g., data link layer) processing. Input system 10 may provide a signal INPUT to the signal regenerator. The signal regenerator may reduce jitter in signal INPUT and output the jitter reduced signal INPUT as signal OUTPUT.

Output system 20 may include a driver 22 and an electronic-to-optical signal converter ("E/O") 24. Driver 22 may receive signal OUTPUT from the signal regenerator. Driver 22 and E/O 24 may together convert electrical signals into stable optical signals and amplify such signals. E/O 24 may transmit such optical signals to an optical network that may include receivers, switches, and routers.

Figure 2:
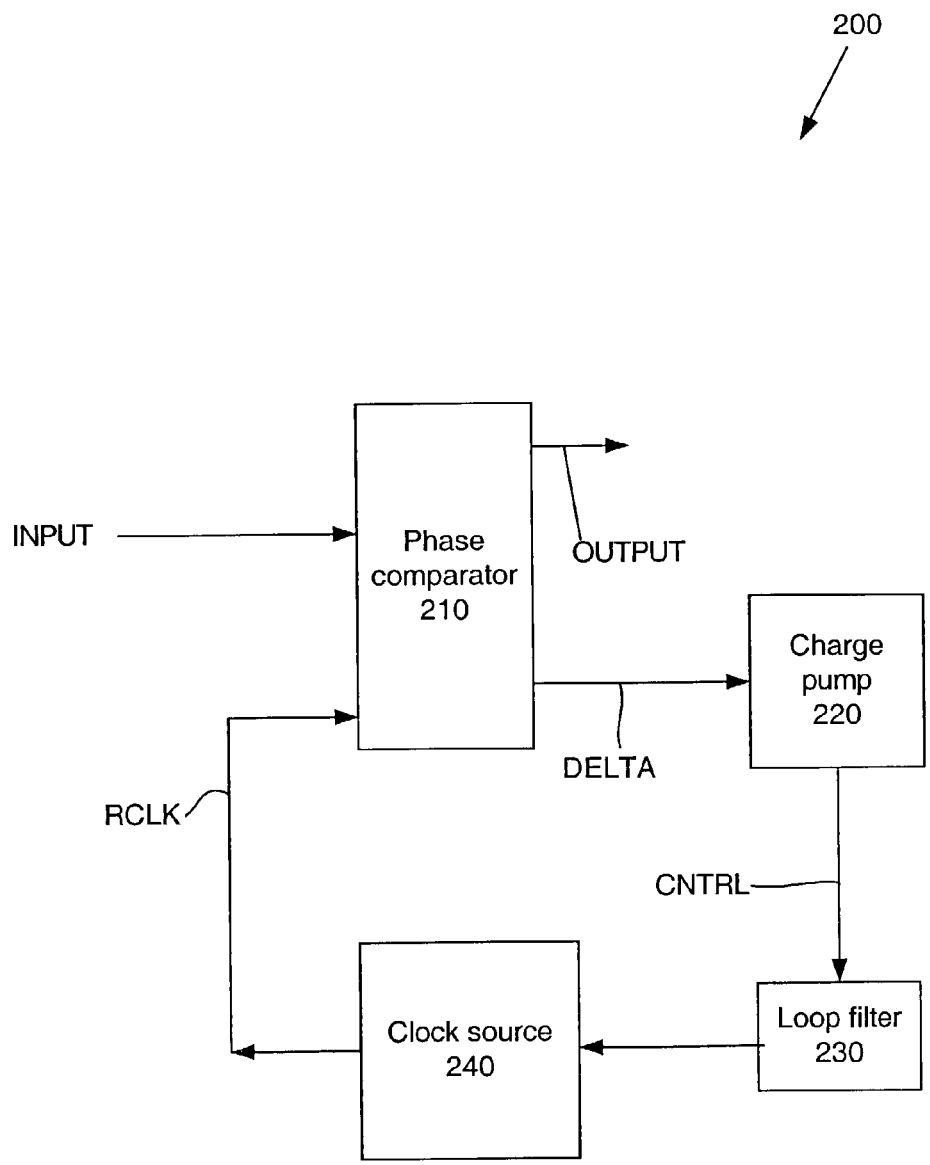
FIG. 2 depicts in block diagram form one possible implementation of a signal regenerator, in accordance with an embodiment of the present invention.

FIG. 2 depicts in block diagram form an embodiment of the present invention in signal regenerator 200. Signal regenerator 200 may receive an input signal (shown as signal INPUT) and output a regenerated version of the input signal (shown as signal OUTPUT) having less jitter than signal INPUT. Signal regenerator 200 may use a clock source 240 to provide a reference clock signal RCLK that can be used to time transitions of signal OUTPUT. Signal regenerator 200 may be implemented as any of or a combination of: hardwired logic, software stored by a memory device and executed by a microprocessor, firmware, an application specific integrated circuit (ASIC), and/or a field programmable gate array (FPGA).

Signal regenerator 200 may include a phase comparator 210, charge pump 220, loop filter 230, and clock source 240. Phase comparator 210 may determine whether the phase of signal INPUT is leading or lagging that of a reference clock signal (shown as RCLK). The phase comparator 210 may output to charge pump 220 a phase difference signal (shown as signal DELTA) that may represent the phase relationship between the signals INPUT and RCLK. Phase comparator 210 may receive signals INPUT and RCLK and may output a digital signal (shown as signal OUTPUT) generated using values of samples of signal INPUT and having transitions timed to transitions of signal RCLK.

The phase comparator 210 may be implemented as an Alexander ("bang—bang") type filter although other phase comparators may be used. One implementation of an Alexander phase detector is described, for example, in Electronic Letters by J. D. H. Alexander in an article entitled, Clock Recovery From Random Binary Signals, Volume 11, page 541–542, Oct. 1975.

Charge pump 220 may output a signal (shown as CNTRL) having a magnitude in proportion to the magnitude of signal DELTA. Loop filter 230 may selectively transfer portions of the signal CNTRL whose frequency is within the pass band of the loop filter 230. Clock source 240 may receive the transferred portion of signal CNTRL. Although a charge pump and loop filter combination is provided as an example herein, other devices may be used to selectively transfer a phase relationship represented by signal CNTRL to the clock source 240 when the frequency of CNTRL is within a pass band frequency range. In one embodiment, for a frequency of signal INPUT that is approximately 10 gigahertz, the pass band of loop filter 230 may have an upper frequency limit of approximately 10 kilohertz.

Figure 3:
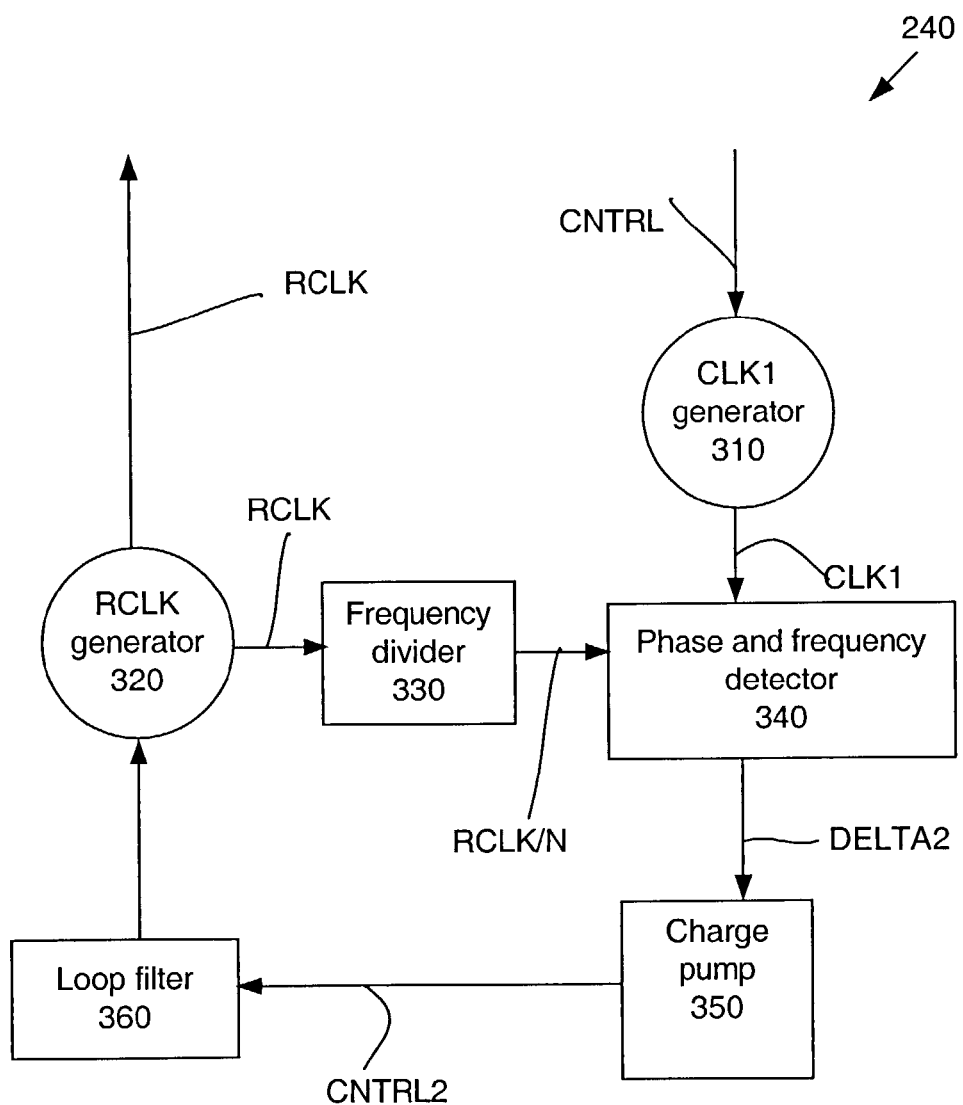
FIG. 3 depicts in block diagram form one possible implementation of a clock source, in accordance with an embodiment of the present invention.

FIG. 3 depicts in block diagram form one possible implementation of clock source 240, in accordance with an embodiment of the present invention. Clock source 240 may use a signal CLK1 as a reference signal to reduce the phase noise of a higher frequency clock signal RCLK. By using signal CLK1 to phase match signal RCLK to signal CLK1, low frequency jitter that may be present in the signal RCLK from RCLK generator 320 may be removed.

Clock source 240 may include a CLK1 generator 310, RCLK generator 320, frequency divider 330, frequency detector 340, charge pump 350, and loop filter 360. CLK1 generator 310 may output a clock signal CLK1. CLK1 generator 310 may use the signal CNTRL transferred by loop filter 230 (FIG. 2) to adjust the phase of signal CLK1. For example, CLK1 generator 310 may respond to signal CNTRL by increasing or decreasing the phase of signal CLK1 in relation to the magnitude of the transferred portion of signal CNTRL. CLK1 generator 310 may be implemented as a voltage controlled oscillator (VCO), voltage-controlled crystal oscillator (VCXO), or LC VCO. In one implementation, signal CLK1 may have a frequency of approximately 622 megahertz, although the frequency of CLK1 may vary depending on a variety of design parameters.

RCLK generator 320 may output a clock signal RCLK. Signal RCLK may have a higher frequency than that of signal CLK1. The frequency of signal RCLK may be substantially the same as that of signal INPUT. A frequency divider 330 may receive signal RCLK and output a clock signal, RCLK/N. The frequency of signal RCLK/N may be 1/N of that of signal RCLK and approximately match the frequency of signal CLK1. Value N may be sixteen (16) but any number greater than one (1) may be used. Phase and frequency detector 340 may compare phases of signals RCLK/N and CLK1. If there is a phase difference between signals RCLK/N and CLK1, phase and frequency detector 340 may output a signal DELTA2 that represents a phase difference between signals RCLK/N and CLK1. Phase and frequency detector 340 may be implemented as a linear phase and frequency detector.

Charge pump 350 may receive signal DELTA2 and may output a signal CNTRL2 having a magnitude in proportion to the magnitude of signal DELTA2. Loop filter 360 may transfer portions of the signal CNTRL2 whose frequency is within the pass band of the loop filter 360. Although a charge pump and loop filter combination is described herein, other devices may be used to selectively transfer a phase relationship represented by CNTRL2 to the RCLK generator 320 when the frequency of signal CNTRL2 is within a pass band frequency range. In one embodiment, for a frequency of signal INPUT that is approximately 10 gigabits, the pass band of loop filter 360 may be approximately between 1 to 10 megahertz.

RCLK generator 320 may respond to the signal CNTRL2 from loop filter 360 by increasing or decreasing the phase of signal RCLK in relation to the magnitude of the transferred portion of signal CNTRL2. For example, if there is no phase difference between signals RCLK/N and CLK1, RCLK generator 320 may not adjust the phase of signal RCLK. RCLK generator 320 may be implemented as a voltage controlled oscillator (VCO), voltage-controlled crystal oscillator (VCXO), or LC VCO. In one implementation, signal RCLK may be approximately 10 gigahertz, although the frequency of RCLK may vary depending on a variety of design parameters.

Figure 4:
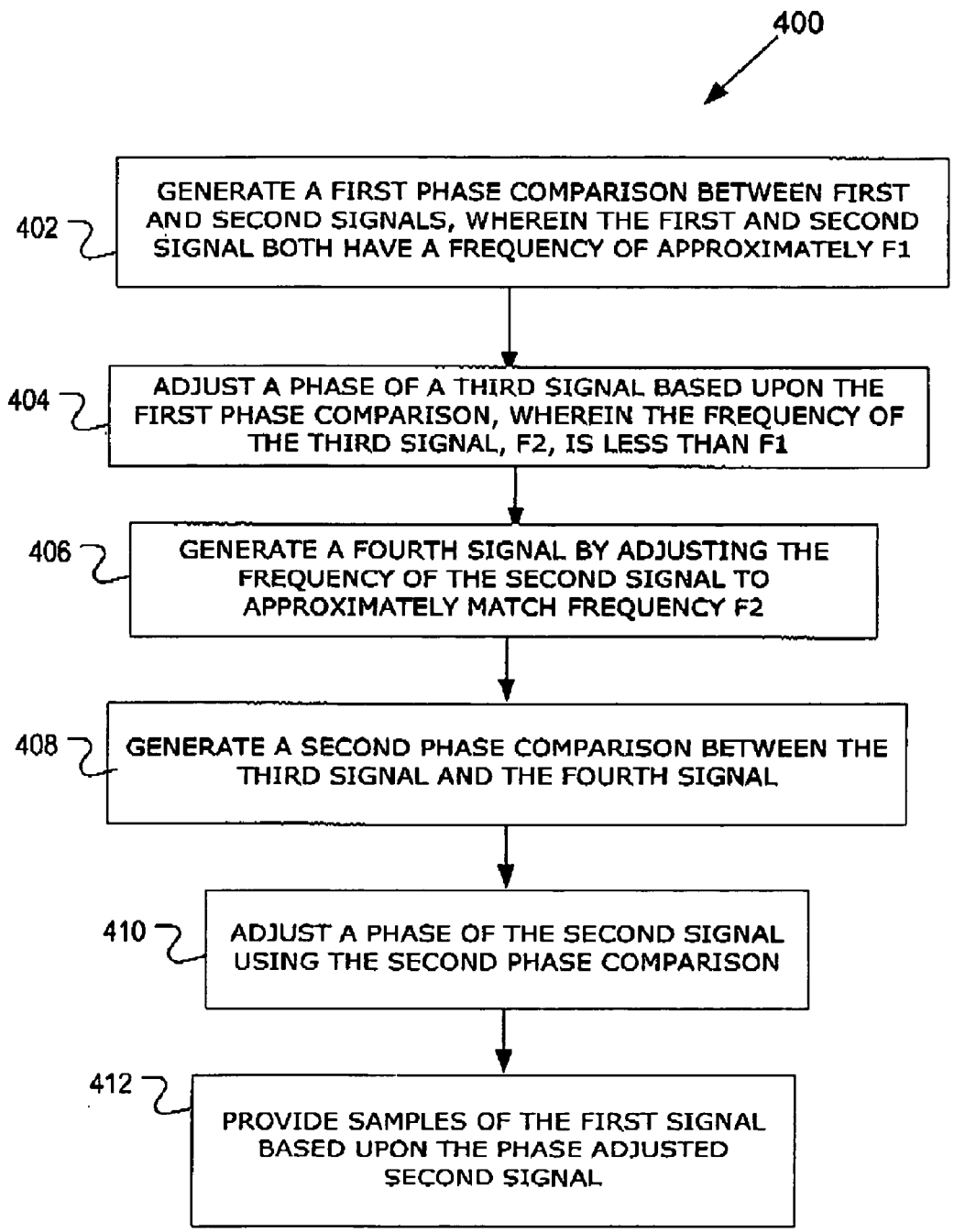
FIG. 4 depicts an example process, in accordance with embodiments of the present invention.

FIG. 4 depicts an example process, in accordance with some embodiments of the present invention. Block 402 may include generating a first phase comparison between first and second signals, wherein the first signal and second signal both have a frequency of approximately F1. For example, with regard to FIG. 2, the first signal may correspond to signal INPUT, the second signal may correspond to clock signal RCLK, and the first phase comparison may correspond to signal DELTA. Block 404 may include adjusting a phase of a third signal based upon the first phase comparison, wherein the frequency of the third signal, F2, is less than frequency F1. For example, with regard to FIG. 3, the third signal may correspond to signal CLK1. Block 406 may include generating a fourth signal by adjusting the frequency of the second signal to approximately match frequency F2. For example, with regard to FIG. 3, the fourth signal may correspond to signal RCLK/N. Block 408 may include generating a second phase comparison between the third signal and the fourth signal. For example, with regard to FIG. 3, the second phase comparison may correspond to signal DELTA2. Block 410 may include adjusting a phase of the second signal using the second phase comparison. Block 412 may include providing samples of the first signal based upon the phase adjusted second signal. For example, with regard to FIG. 2, the samples may correspond to signal OUTPUT.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims. Although some description has been made with respect to communications systems, the teachings provided herein can be applied to any situations where jitter is to be reduced.

What is claimed is:

1. A method comprising:
   generating a first phase comparison between first and second signals, wherein the first and second signal both have a frequency of approximately F1;
   adjusting a phase of a third signal based upon the first phase comparison, wherein the frequency of the third signal, F2, is less than F1;
   generating a fourth signal by adjusting the frequency of the second signal to approximately match frequency F2;
   generating a second phase comparison between the third signal and the fourth signal;
   adjusting a phase of the second signal using the second phase comparison; and
   providing samples of the first signal based upon the phase adjusted second signal.

2. The method of claim 1, wherein the first signal comprises a data signal.

3. The method of claim 1, wherein the second signal comprises a clock signal.

4. The method of claim 1, wherein the third signal comprises a clock signal.

5. The method of claim 1, wherein the third signal includes less phase noise than the second signal.

6. An apparatus comprising:
   a phase comparator to compare phases of first and second signals and to output a first phase comparison;
   a charge pump to output a control signal to modify a phase of the second signal based upon the first phase comparison;
   a loop filter to selectively transmit the control signal in response to detection of the control signal within a pass band of the loop filter; and a clock source to generate the second signal based upon a clock signal, wherein the clock signal has a lower frequency than the second signal and wherein the clock source comprises:
a clock signal generator to output the clock signal and to modify a phase of the clock signal based upon the control signal,
a frequency divider to generate a frequency reduced second signal having a frequency approximately matched to a frequency of the clock signal,
a phase and frequency detector to output a second phase comparison between phases of the frequency reduced second signal and the clock signal,
a second charge pump to output a second control signal to modify a phase of the second signal in response to the second phase comparison,
a second signal generator to output the second signal and to modify a phase of the second signal in response to the second control signal, and
a second loop filter to transfer the second control signal to the second signal generator when the second control signal has a frequency within a pass band of the second loop filter.

7. The apparatus of claim 6, wherein the phase comparator is to output samples of the first signal based upon the second signal.

8. The apparatus of claim 6, wherein the clock signal includes less phase noise than the second signal.

9. A system comprising:
a layer two device to output a first signal;
a phase comparator to compare phases of first and second signals and to output a first phase comparison and to output samples of the first signal based upon the second signal;
a charge pump to output a control signal to modify a phase of the second signal in response to the first phase comparison;
a loop filter to transfer the control signal when the control signal has a frequency within a pass band of the loop filter; and
a clock source to generate the second signal based upon a clock signal, wherein the clock signal has a lower frequency than the second signal and wherein the clock source comprises:
a clock signal generator to output the clock signal and to modify a phase of the clock signal based upon the control signal,
a frequency divider to generate a frequency reduced second signal having a frequency approximately matched to a frequency of the clock signal,
a phase and frequency detector to output a second phase comparison between phases of the frequency reduced second signal and the clock signal,
a second charge pump to output a second control signal to modify a phase of the second signal in response to the second phase comparison,
a second signal generator to output the second signal and to modify a phase of the second signal in response to the second control signal, and
a second loop filter to transfer the second control signal to the second signal generator when the second control signal has a frequency within a pass band of the second loop filter.

10. The system of claim 9, wherein the layer two device receives an input signal and the layer two device comprises logic to perform media access control on the input signal in compliance with any IEEE 802.3 document available on or before Jul. 25, 2002 and wherein the layer two device provides a resulting signal as the first signal.

11. The system of claim 9, wherein the layer two device receives an input signal and the layer two device comprises logic to perform forward error correction on the input signal in compliance with ITU-T G.709 and wherein the layer two device provides a resulting signal as the first signal.

12. The system of claim 9, further comprising a data bus coupled to the layer two device to receive and provide signals.

13. The system of claim 12, further comprising a switch fabric coupled to the data bus.

14. The system of claim 12, wherein the data bus is compliant with Ethernet.

15. The system of claim 12, wherein the data bus is compliant with PCI.

16. The system of claim 12, further comprising a packet processor coupled to the data bus.

17. The system of claim 9, further comprising an electrical-to-optical converter to convert the samples of the first signal into an optical format.

* * * * *